(12) United States Patent
Gerlach

(10) Patent No.: US 12,034,272 B2
(45) Date of Patent: Jul. 9, 2024

(54) VERTICAL CAVITY SURFACE EMITTING LASER DEVICE WITH INTEGRATED PHOTODIODE

(71) Applicant: TRUMPF Photonic Components GmbH, Ulm (DE)

(72) Inventor: Philipp Henning Gerlach, Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 1028 days.

(21) Appl. No.: 16/930,435

(22) Filed: Jul. 16, 2020

(65) Prior Publication Data

US 2020/0350744 A1 Nov. 5, 2020

Related U.S. Application Data

(63) Continuation of application No. PCT/EP2019/050360, filed on Jan. 9, 2019.

(30) Foreign Application Priority Data

Jan. 19, 2018 (EP) ..................................... 18152476

(51) Int. Cl.
*H01S 5/00* (2006.01)
*H01S 5/026* (2006.01)
(Continued)

(52) U.S. Cl.
CPC ........ *H01S 5/0264* (2013.01); *H01S 5/18327* (2013.01); *H01S 5/18341* (2013.01);
(Continued)

(58) Field of Classification Search
CPC ............... H01S 5/0264; H01S 5/18327; H01S 5/18341; H01S 5/18361; H01S 5/0237; H01S 5/18305
See application file for complete search history.

(56) References Cited

U.S. PATENT DOCUMENTS 5,574,744 A * 11/1996 Gaw .................. G02B 6/12004
372/50.21
5,706,306 A 1/1998 Jiang et al.
5,757,837 A 5/1998 Chang-Hasnain et al.
(Continued)

FOREIGN PATENT DOCUMENTS

CN 1476132 A 2/2004
CN 104488148 A 4/2015
(Continued)

*Primary Examiner* — Kinam Park
(74) *Attorney, Agent, or Firm* — LEYDIG, VOIT & MAYER, LTD.

(57) ABSTRACT

A vertical cavity surface emitting laser includes four contacts and an optical resonator (having two Bragg reflectors, a photodiode, and an active layer between the Bragg reflectors). The second Bragg reflector has three parts. The first part has a pair of layers with different refractive indices and a second conductivity type. The second part has a pair of layers with different refractive indices and a first conductivity type. The third part has a pair of layers with different refractive indices and the second conductivity type. A light absorption structure of the photodiode is between the second and third parts. The first and second electrical contacts provide a current to pump the resonator. The light absorption structure is outside the current path. The third and fourth electrical contacts contact the photodiode. The second and third electrical contact respectively contact the first and second parts and are separated by a semiconductor layer.

14 Claims, 7 Drawing Sheets

(51) Int. Cl.
*H01S 5/183* (2006.01)
*H01S 5/0237* (2021.01)

(52) U.S. Cl.
CPC ........ *H01S 5/18361* (2013.01); *H01S 5/0237* (2021.01); *H01S 5/18305* (2013.01)

(56) References Cited

U.S. PATENT DOCUMENTS

| | | | |
|---|---|---|---|
| 5,892,786 A | 4/1999 | Lott | |
| 6,151,344 A * | 11/2000 | Kiely | H01S 5/183 372/50.21 |
| 6,222,202 B1 * | 4/2001 | Babic | H01S 5/0264 257/85 |
| 2004/0028092 A1 | 2/2004 | Kim | |
| 2007/0054437 A1 * | 3/2007 | Kaneko | H01S 5/18313 438/104 |
| 2007/0081568 A1 * | 4/2007 | Imai | B82Y 20/00 372/50.21 |
| 2007/0286249 A1 | 12/2007 | Nishida | |
| 2008/0117947 A1 * | 5/2008 | Masui | H01L 31/101 372/50.21 |
| 2011/0064110 A1 * | 3/2011 | Gerlach | H01S 5/18347 372/50.21 |
| 2011/0164633 A1 * | 7/2011 | Moench | H01S 5/06808 372/50.21 |
| 2012/0128020 A1 * | 5/2012 | Gerlach | H01S 5/0264 372/50.11 |
| 2015/0139260 A1 | 5/2015 | Gerlach et al. | |
| 2017/0302059 A1 * | 10/2017 | Gerlach | H01S 5/18386 |
| 2018/0337516 A1 * | 11/2018 | Tatum | H01S 5/18338 |
| 2020/0287351 A1 * | 9/2020 | Gerlach | H01S 5/305 |

FOREIGN PATENT DOCUMENTS

| | | |
|---|---|---|
| CN | 106797107 A | 5/2017 |
| EP | 0993087 A1 | 4/2000 |
| WO | WO 2009136348 A1 | 11/2009 |

* cited by examiner

VERTICAL CAVITY SURFACE EMITTING LASER DEVICE WITH INTEGRATED PHOTODIODE

CROSS-REFERENCE TO PRIOR APPLICATIONS

This application is a continuation of International Patent Application No. PCT/EP2019/050360, filed on Jan. 9, 2019, which claims priority to European Patent Application No. EP 18152476.0, filed on Jan. 19, 2018. The entire disclosure of both applications is hereby incorporated by reference herein.

FIELD

The present invention relates to a Vertical Cavity Surface Emitting Laser (VCSEL) device with integrated photodiode. The present invention further relates to a corresponding method of fabricating such a VCSEL device.

BACKGROUND

WO 2009/136348 A1 corresponding to US 2011/0064110 A1 discloses a Vertical Cavity Surface Emitting Laser device comprising a VCSEL with a monolithically integrated photodiode, which is arranged between a substrate and a first distributed Bragg reflector (DBR) of the VCSEL. The photodiode is formed of a layer sequence of a first n-doped region, a p-doped region, an intrinsic region and a second n-doped region of a semiconductor material. The photodiode and the laser share a common electrode, which is realized as an Ohmic n-contact at said first n-doped region.

U.S. Pat. No. 5,757,837 A discloses a VCSEL, which is constructed with an intracavity quantum well photodetector. EP 0 993 087 A1 discloses a light emitting device and photodetector combination having a structure where the layer of the photodetector that contacts the light emitting device has a semiconductor conductivity type polarity opposite that of the light emitting device. U.S. Pat. No. 5,892,786 A discloses an intracavity sensor based output power control for microcavity light emitting devices.

SUMMARY

In an embodiment, the present invention provides a vertical cavity surface emitting laser (VCSEL) device that includes: a first electrical contact; a third electrical contact; a fourth electrical contact; and an optical resonator. The optical resonator includes: a first distributed Bragg reflector; a photodiode; a second distributed Bragg reflector; and an active layer for light emission. The active layer is arranged between the first distributed Bragg reflector and the second distributed Bragg reflector. The second distributed Bragg reflector comprises a first part, a second part, and a third part. The first part comprises at least one first pair of layers with different refractive indices. The at least one first pair of layers is of a second conductivity type. The second part comprises at least one second pair of layers with different refractive indices. The at least one second pair of layers is is of a first conductivity type different than the second conductivity type. The third part comprises at least one third pair of layers with different refractive indices. The at least one third pair of layers is of the second conductivity type. A light absorption structure of the photodiode is arranged between the second part and the third part. The first electrical contact and a further electrical contact are arranged to provide an electrical drive current to electrically pump the optical resonator. The light absorption structure is arranged outside a current path of the electrical drive current. The third electrical contact and the fourth electrical contact are arranged to electrically contact the photodiode. The further electrical contact is a second electrical contact. The second electrical contact electrically contacts the first part. The third electrical contact electrically contacts the second part. The second electrical contact and the third electrical contact are separated by a semiconductor layer structure.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
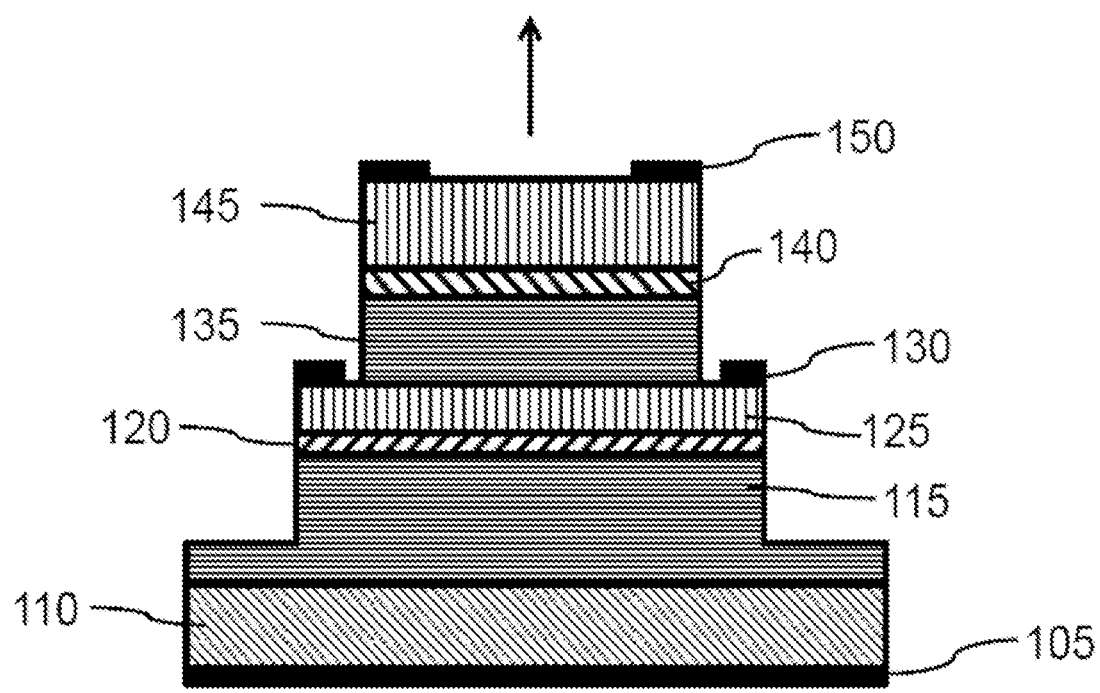
FIG. 1 shows a first VCSEL device with integrated photodiode.

Embodiments of the present invention provide an improved Vertical Cavity Surface Emitting Laser device with integrated photodiode.

According to a first aspect, a Vertical Cavity Surface Emitting Laser (VCSEL) device is provided. The VCSEL device comprises a first electrical contact, a substrate, a third electrical contact, a fourth electrical contact, and an optical resonator. The optical resonator comprises a first distributed Bragg reflector (DBR), a photodiode, a second DBR, and an active layer for light emission. The active layer is arranged between the first DBR and the second DBR. The first DBR may be arranged between the substrate and the active layer. The second DBR comprises a first part, a second part, and a third part. The first part comprises at least one pair of layers with different refractive indices. The at least one pair of layers is characterized by a second conductivity type. The second part comprises at least one pair of layers with different refractive indices. The at least one pair of layers is characterized by a first conductivity type different than the second conductivity type. The third part comprises at least one pair of layers with different refractive indices. The at least one pair of layers of the third part is characterized by the second conductivity type. A light absorption structure of the photodiode is arranged between the second part and the third part. The first electrical contact and a further electrical contact are arranged to provide an electrical drive current to electrically pump the optical resonator. The light absorption structure is arranged outside a current path of the electrical drive current. The third electrical contact and the fourth electrical contact are arranged to electrically contact the photodiode. The further electrical contact may be the third electrical contact or an additional second electrical contact.

Arrangement of the light absorption structure of the photodiode between the second part and the third part of the second (upper in view of distance to substrate) DBR may reduce absorption of light spontaneously emitted by the active layer in comparison to prior art solutions. Signal-to-noise ratio may therefore be improved. Furthermore, processing may be simplified and especially processing time may be reduced because deep etching (through several micrometers of semiconductor materials) to contact the photodiode, which is usually placed in the first (lower in the view of the distance to substrate) DBR, is avoided. Finally, electrical isolation between the active layer and the photodiode may be improved by arranging the light absorption structure outside the current path of the drive current to electrically pump the active layer.

The second DBR may comprise four, five, or more parts. Each layer of the pair of layers may be characterized by a thickness of a quarter of the emission wavelength of the VCSEL device in the respective material of the layer. The VCSEL device may comprise further layers like current distribution layers and current confinement layers (e.g. oxide aperture). Each of the layers may comprise two, three, four, or more sub-layers building the layer. The active layer may, for example, comprise a multitude of sub-layers building a quantum well structure or layer.

The VCSEL device may be a bottom emitter (emitting laser light through the first DBR or through the substrate) or a top emitter (emitting laser light away from the first DBR or the substrate).

The substrate—or to be more specific the semiconductor substrate (e.g. gallium arsenide substrate)—and the first DBR may, according to one embodiment, be of the first conductivity type. The substrate may, according to an alternative embodiment, be essentially not electrically conductive. The substrate may, for example, comprise or consist of undoped semiconductor material. The concentration of materials, which are used to n-dope or p-dope semiconductor material, is in undoped semiconductors preferably below $10^{17}/cm^3$. It may not be possible to avoid contamination of the respective semiconductor material with any doping material (background doping).

The first conductivity type may be characterized by n-doped material and the second conductivity type may be characterized by p-doped material.

The further electrode is an additional second electrical contact. The second electrical contact electrically contacts the first part. The third electrical contact electrically contacts the second part. The second electrical contact and the third electrical contact are separated by a semiconductor layer structure. The semiconductor layer structure may, for example, be material of the first conductivity type.

Providing a separate and additional second electrical contact between the first electrical contact and the second electrical contact may further improve electrical isolation between the electrical drive current provided by means of the first electrical contact and the second electrical contact and the, for example, self mixing interference sensor signal generated by the photodiode which can be measured via the third and fourth electrical contact.

The semiconductor layer structure may be an isolation structure, which is arranged to electrically isolate the third electrical contact from the second electrical contact. The isolation structure provides an electrical but no optical isolation. The isolation structure is therefore essentially transparent in the wavelength range of the emission wavelength of the VCSEL structure. The isolation structure may be a separate semiconductor layer structure arranged between the first part of the second DBR and the second part of the second DBR.

The isolation structure may comprise at least one pair of layers. Each of the one or more pair of layers comprises a first layer with a first refractive index and a second layer with a second refractive index different than the first refractive index. The first and the second layer may be quarter wavelength layers contributing to the reflectivity of the second DBR. The isolation structure may increase the distance between the active layer and the absorption structure of the photodiode. The thickness of the isolation structure in a direction perpendicular to the active layer may therefore decrease the probability of detection of light spontaneously emitted by the active layer due to the increasing distance between active layer and photodiode.

The at least one pair of layer comprised by the isolation structure may, for example, comprise undoped semiconductor material to increase electrical isolation. This leads in the band diagram to strong hetero offsets which may increase electrical isolation between the second and the third electrical contact.

The material of the first layer may comprise a first aluminum concentration, and a material of the second layer comprises a second aluminum concentration lower than the first aluminum concentration. The aluminum concentration determines the refractive index of the respective layer. An interface between the first layer and the second layer, in which the first aluminum concentration changes to the second aluminum concentration, is characterized by a thickness of less than 1 nm. The steep grading between the first and the second layer supports electrical isolation. The steep grading may be limited by surface roughness and production tolerances.

The isolation structure may alternatively or in addition comprise several pair of layers comprising the first layer and the second layer. At least two of the first layers are of the first conductivity type, and at least two of the second layers are of the second conductivity type. The isolation structure may, for example, comprise an alternating p-n-p-n (or n-p-n-p) doping to increase electrical isolation.

The second electrical contact may be electrically contacted to a highly conductive p-doped contact layer, which is arranged in a node of a standing wave pattern of the optical resonator during operation of the VCSEL device. The highly conductive p-doped contact layer may be characterized by a carbon doping concentration preferably greater than $10^{19}/cm^3$ and more preferably greater than $10^{20}/cm^3$. High conductivity of the p-doped contact layer may provide a good current distribution across the active layer. Placing the high doping of the p-doped contact layer in a node of the standing wave pattern may avoid or at least reduce modal absorption of laser light generated during operation of the VCSEL device.

The further electrode may alternatively be the third electrode. The third electrode is electrically contacted to the first part of the second DBR. The junction between the first part of the second DBR and the second part of the second DBR may be a pn-junction arranged between the third electrode and the fourth electrode. The pn-junction is contacted in forward direction (direction bias) during operation of the VCSEL device. The pn-junction may increase electrical isolation between the electrical drive current for pumping the active layer of the VCSEL device and the photodiode.

The VCSEL device may, according to one embodiment, be arranged to emit laser light through or in the direction of the substrate (bottom emitter). A doped substrate (e.g. n-doped GaAs substrate which is usually used because it is available in high quality) may cause absorption of laser light. It may therefore be preferred to thin the substrate, or alternatively to use an undoped semiconductor substrate, to reduce absorption of laser light. The VCSEL device may in this case comprise a first current distribution layer arranged between the substrate and the first DBR. The first current distribution layer is electrically connected to the first electrode. The first electrode is usually the n-contact of the active layer of the VCSEL device. The first current distribution layer is characterized by a high electrical conductivity (e.g. high n-doping). Absorption of laser light may be reduced by arranging the first current distribution layer in a node of the standing wave pattern of the VCSEL device. The substrate may alternatively be partly or even completely removed after processing of the VCSEL device.

The third part of the second DBR may comprise preferably between 2 and 20 pairs of layers of different refractive indices, more preferably between 5 and 15 pairs of layers and most preferably between 8 and 12 pairs of layers. The Al concentration of for example AlGaAs($Al_xGa_{(1-x)}As$) layers may vary between 15% and 90% to provide different refractive indices. The pairs of layers of the second DBR increase the intensity of the standing wave pattern inside the cavity.

The second part of the second DBR may comprise at least two pairs of layers of the first conductivity type. The first part and the second part of the second DBR may comprise more pair of layers of different refractive indices than the third part of the second DBR. Intensity of light spontaneously emitted by the active layer may be reduced with increasing number of pairs of layers because of the increasing distance between active layer and absorption structure.

The absorption structure may comprise an intrinsic layer with a thickness of less than 100 nanometers. The intrinsic layer of the photodiode may comprise undoped absorbing semiconductor with low bandgap, like, for example, undoped GaAs. The absorption structure may be placed such that it is in an antinode (maximum) of a standing wave pattern in the laser cavity to have high absorption for laser light during operation of the VCSEL device. A typical thickness of the absorption structure may be 100 nm. Placing a relative thin absorption structure in the antinode of the standing wave pattern may increase probability of absorption of laser light in comparison to absorption of light spontaneously emitted by the active layer. A drawback of the thin absorption layer may be a relative high capacity limiting switching speed of the VCSEL device. The absorption structure may therefore according to an alternative embodiment be characterized by a thickness covering two, three or more antinodes of the standing wave pattern within the laser cavity. The increased thickness of the absorption structure may lower the capacity but it may make the design more sensitive to spontaneous light, as the total absorption for spontaneous light increases with thickness of absorbing layer.

The VCSEL device may be comprised by an optical sensor. The optical sensor may be comprised by a mobile communication device. The optical sensor may be used for distance detection, velocity detection, particle density detection (PM 2.5 measurements) gesture control and especially all sensor applications which are based on self mixing interference measurements.

According to a further aspect a method of fabricating a VCSEL device with integrated photodiode is provided. The method may include the steps of:

providing a substrate, providing a first electrical contact, wherein the first electrical contact and a further electrical contact are arranged to provide an electrical drive current to electrically pump the VCSEL device, providing a first DBR, providing an active layer such that the first DBR is arranged between the active layer and the substrate, providing a first part of a second DBR such that the active layer is arranged between the first DBR and the first part, wherein the first part comprises at least one pair of layers with different refractive indices, wherein the at least one pair of layers is characterized by a second conductivity type, providing a second part of the second DBR, wherein the second part comprises at least one pair of layers with different refractive indices, wherein the at least one pair of layers is characterized by a first conductivity type different than the second conductivity type, providing a third part of the second DBR, wherein the third part comprises at least one pair of layers with different refractive indices, wherein the at least one pair of layers is characterized by the second conductivity type, providing a light absorption structure of the photodiode between the second part and the third part, wherein the light absorption structure is arranged outside a current path of the electrical drive current, providing a third electrical contact, providing a fourth electrical contact, wherein the third electrical contact and the fourth electrical contact are arranged to electrically contact the photodiode, wherein the further electrode is a second electrical contact (127), the method further comprising electrically contacting the first part (125) by the second electrical contact (127), and electrically contacting the second part (135) by the third electrical contact (130), and separating the second electrical contact (127) and the third electrical contact (130) by a semiconductor layer structure.

The steps need not be performed in the order given above. The different layers may be deposited by epitaxial methods like MOCVD, MBE and the like. The substrate may be removed in a subsequent processing step.

It shall be understood that the VCSEL device according to any embodiment described above and the method of fabricating the VCSEL device have similar and/or identical embodiments.

These and other aspects of the present invention will be apparent from and elucidated with reference to the embodiments described hereinafter.

Various embodiments of the invention will now be described by means of the Figures. In the Figures, like numbers refer to like objects throughout. Objects in the Figures are not necessarily drawn to scale.

FIG. 1 shows a principal sketch of a first VCSEL device with integrated photodiode. The first VCSEL is a top emitting VCSEL device emitting laser light in a direction away from a substrate 110 as indicated by the arrow. The substrate 110 consists of n-doped gallium arsenide. A first electrical contact 105 is provided on a bottom side of the substrate 110. The first electrical contact 105 is a n-contact of an active layer 120 of the VCSEL device. On the top side of the substrate 110 is a first DBR 115 provided comprising 40 pairs of layers with a first and a second refractive index. The pairs of layers of the first DBR 115 comprise n-doped AlGaAs layers. The thickness of the layers is adapted to the emission wavelength of the VCSEL in order to provide the requested reflectivity of more than 99.9%. On top of the first DBR 115 is the active layer 120 provided. The active layer 120 comprises a quantum well structure for light generation. A n-current injection layer may be arranged between the first DBR 115 and the active layer 120. A first part of the second DBR 125 is provided on top of the active layer 120. The first part of the second DBR 125 comprises 15 pairs of layers with a first and second refractive index. The pairs of layers of the first part of the second DBR 125 comprise p-doped AlGaAs layers. The uppermost layer of the first part of the second DBR 125 is highly conductive and contacted by means of a third electrical contact 130. A second part of the second DBR 135 is provided on top of the first part of the second DBR 125. The second part of the second DBR 135 comprises one pair of layers with a first and second refractive index. The pair of layers of the second part of the second DBR 135 comprises n-doped AlGaAs layers. An absorption structure 140 is provided on top of the second part of the second DBR 135. The absorption structure consists of a bulk layer of undoped GaAs with a thickness of 90 nm. A third part of the second DBR 145 is provided on top of the absorption layer. The third part of the second DBR 145 comprises eight pair of layers with a first and second refractive index. The pair of layers of the third part of the second DBR 145 comprises p-doped AlGaAs layers. A, for example, ring shaped fourth electrical contact 150 is provided on top of the third part of the second DBR 145. The fourth electrical contact 150 is a p-contact of the photodiode, which is built by the third electrical contact 130, the fourth electrical contact 150, and the intermediate semiconductor layers. The third electrical contact 130 is, in this embodiment of the VCSEL device, the p-contact of the active layer 120. The photodiode is indirectly contacted by means of the third contact 130 and the fourth contact 150. The doping sequence of the different structures (first DBR 115 and different parts of the second DBR 125, 135, 145) of the VCSEL device may be different in case of a p-doped substrate 110 (expensive) or an undoped substrate 110, which may be used in case of a bottom emitter (see below). Polarity of the electrical contacts may be adapted in accordance with doping sequence of the different structures.

Figure 2:
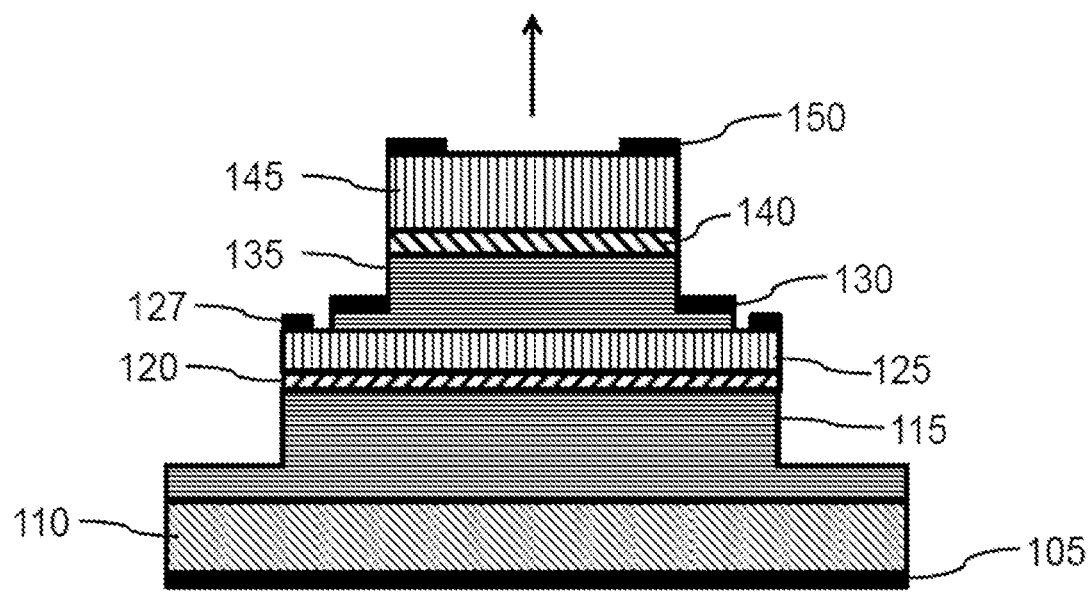
FIG. 2 shows a second VCSEL device with integrated photodiode.

FIG. 2 shows a principal sketch of a second VCSEL device with integrated photodiode. The configuration of the second VCSEL device is similar as described with respect to FIG. 1. The essential difference is that electrical contacting of the light emitting part of the VCSEL device is separated from the electrical contacting of the photodiode. The first part of the second DBR 125 is contacted by a second electrical contact 127. The second electrical contact 127 is provided on top of the uppermost highly p-conductive layer of the first part of the second DBR 125. The second electrical contact 127 is the p-contact of the laser cavity. The third electrical contact 130 is provided on top of one preferably highly n-conductive layer of the second part of the second DBR 135, which is preferably arranged in a node of the standing pace pattern to reduce the optical absorption. The third electrical contact 130 is the n-contact of the photodiode, which is arranged between the third electrical contact 130 and the fourth electrical contact 150. There is at least one intermediate layer (e.g. pair of layers with different refractive indices) between the second electrical contact and the third electrical contact in order to increase electrical isolation between the light emitting part and the light detecting part of the VCSEL device.

Figure 3:
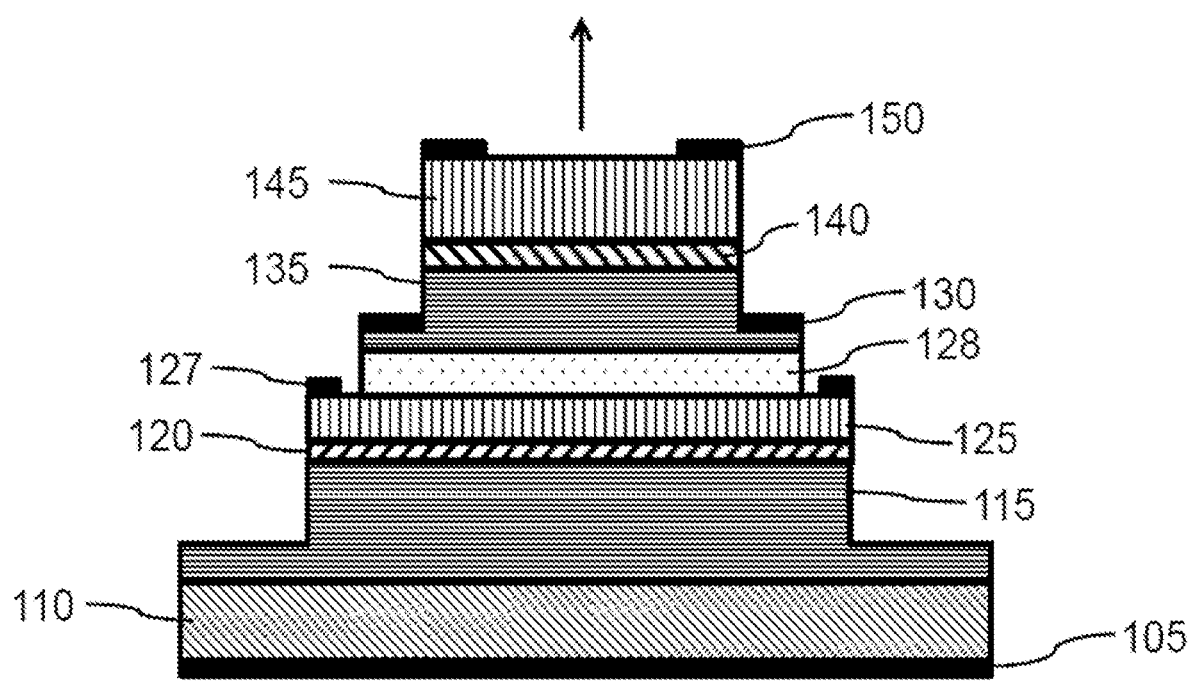
FIG. 3 shows a third VCSEL device with integrated photodiode.

FIG. 3 shows a principal sketch of a third VCSEL device with integrated photodiode. The configuration of the third VCSEL device is similar as described with respect to FIG. 2. A difference is that there is an isolation structure 128, which is provided between the first part of the second DBR 125 and the second part of the second DBR 135. The isolation structure 128 is arranged to increase electrical isolation between the light emitting part of the VCSEL device and the light detecting part of the VCSEL device. The isolation structure 128 may be arranged such that disturbance of light emission by means of the VCSEL device is avoided. The isolation structure 128 may be arranged to support the reflectivity of the second DBR. The isolation structure 128 of the third VCSEL device comprises in this embodiment one pair of layers of undoped semiconductor material (e.g. $Al_xGa_{(1-x)}As$ layers with different Al content). The two layers of the pair of layers have different refractive index and a thickness of a quarter of the emission wavelength of the VCSEL device. The isolation structure 128 therefore contributes to the reflectivity of the second DBR and may in this case be considered as part of the second DBR. Using essentially undoped semiconductor material avoids or at least reduces optical losses.

Figure 4:
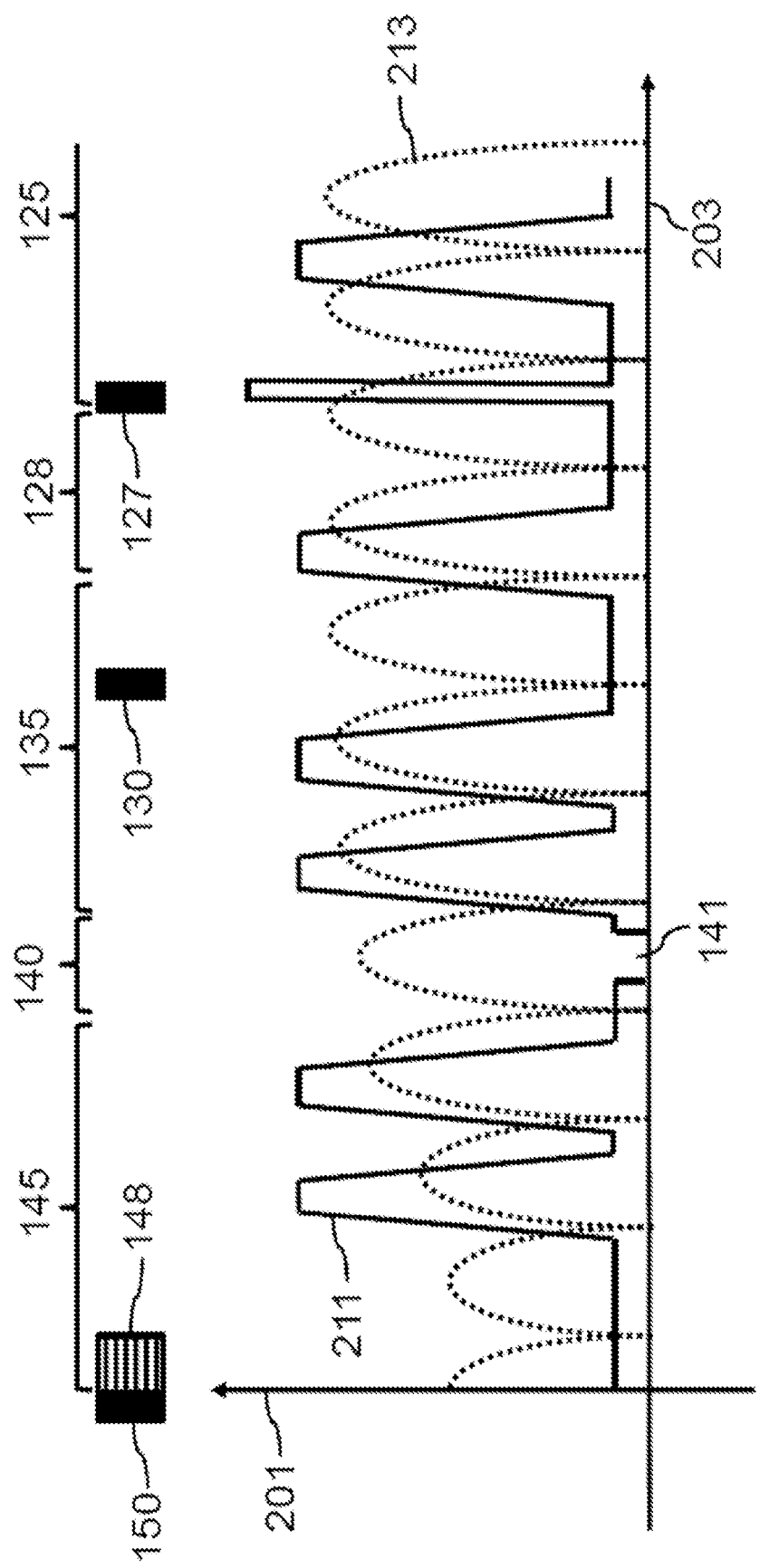
FIG. 4 shows a part of a standing wave pattern of a fourth VCSEL device in relation to the layer arrangement of the integrated photodiode.

FIG. 4 shows a principal sketch of a part of a standing wave pattern of a fourth VCSEL device in relation to the layer arrangement of the integrated photodiode. The fourth VCSEL device is again a top emitter as discussed with respect to FIG. 1-3. The fourth VCSEL device comprises a n-doped GaAs substrate and $Al_xGa_{(1-x)}As$ layers with changing aluminum content as indicated by the y-axis showing the aluminum concentration 201 depending on the distance to the laser facet 203 from left to right. FIG. 4 shows the upper part of the semiconductor layer stack discussed in FIGS. 1-3 starting with the fourth electrical contact 150 shown on the left side of FIG. 4. The fourth electrical contact 150 is in electrical contact with a highly p-doped cap layer and builds the anode contact of the photodiode. The cap layer ends in an anti-phase position, so that a grating etch process may be used to process a grating 148 to realize a polarization sensitive reflectivity of the second DBR. The grating is part of the third part of the second DBR 145 which further comprises (going from left to right in FIG. 4) some p-doped DBR layers with graded interfaces between the $Al_xGa_{(1-x)}As$ layers with different refractive indices. For a VCSEL device emitting laser light with an emission wavelength of 850 nm, the Al concentration may vary between 15% and 90% as indicated by the aluminum profile 211. The number of the pair of layers in the third part of the second DBR 145 is in this embodiment 10. An absorption structure 140 is arranged between the third part of the second DBR 145 and a second part of the second DBR 135. The absorption structure 140 comprises an absorbing layer of the photodiode which is an intrinsic layer 141 with a thickness of 120 nm consisting of an undoped absorbing GaAs with low bandgap. The intrinsic layer 141 is placed such that it is in an antinode (maximum)

of the standing wave pattern 213. The second part of the second DBR 135 follows below the photodiode (absorption structure 140) and comprises n-doped pairs of $Al_xGa_{(1-x)}As$ layers with different refractive indices to continue the second DBR of the VCSEL structure. The second part of the second DBR 135 comprises after two pair of layers a disruption within the pair of layers in the second DBR. The disruption is a bulk layer, which is used to stop etching in order to provide the n-contact of the photodiode, the third electrical contact 130. The material is in this embodiment low Al-containing (e.g. 15% AlGas). The bulk layer is thick enough to cope with the spread of etching inhomogeneities. The thickness of the bulk layer is n*λ/2 (with n= 1, 2, 3 . . . ) and X the emission wavelength of the VCSEL device within the material of the bulk layer. The photodiode cathode contact of the photodiode (third electrical contact 130) will be placed in this bulk layer (see, for example, description of FIG. 5). It should be noted that the spread in etching will translate into different contact positions of the contact between the bulk layer and the third electrical contact 130. The contact quality does not depend on the position and the actual etching depth because the material is the same. An isolation structure 128 is arranged between the second part of the second DBR 135 and a first part of the second DBR 125. The isolation structures 128 comprises two pair of layers of undoped $Al_xGa_{(1-x)}As$ with different aluminum concentration and a thickness of a quarter of the emission wavelength of the VCSEL device. The undoped $Al_xGa_{(1-x)}As$ layers contribute to the reflectivity of the second DBR and ensure electrical isolation between the photodiode and the light emitting part of the VCSEL device comprising the active layer. A further disruption of the second DBR is provided at the right (or lower) end of the isolation structure 128. The disruption comprises a thin AlAs layer with a thickness of, for example, 4 nm which is used in this embodiment to provide an etch stop to deal with uncertainties in dry etching process which may be used to open the semiconductor layer stack to provide a second electrical contact 127 on top of the first part of the second DBR 125. The thickness of the bulk layer just above the AlAs layer is designed such that the dry etching has no problem to stop in this layer. The dry etching should stop just above a thin AlAs layer (thickness of the bulk layer n*λ/2 with n=1, 2, 3 . . . and X the emission wavelength of the VCSEL device within the material of the bulk layer as discussed above). After dry etching, a selective wet chemical etch is used to stop on the AlAs layer. The wet chemical etching process needs to be very selective to AlAs. Citric acid may be used for this purpose. After wet chemical etching, the etching depth is uniform over the wafer due to the fact that it stops selective on AlAs. A highly p-doped contact layer is provided underneath the AlAs-layer. The contact layer is placed in the node of the standing wave pattern 213 so that the high doping does not result in strong modal absorption of laser light. The contact layer is designed to be used as contact layer for the second electrical contact 127 (VCSEL anode contact). The first part of the second DBR 125 follows below the contact layer and comprises p-doped pair of layers of $Al_xGa_{(1-x)}As$ as described above. The aluminum concentration of the layers with high and low refractive index may be the same or may be different in the first part, second part or third part of the second DBR 125, 135, 145. The remaining structure may be similar as discussed with respect to FIGS. 1-3.

Figure 5:
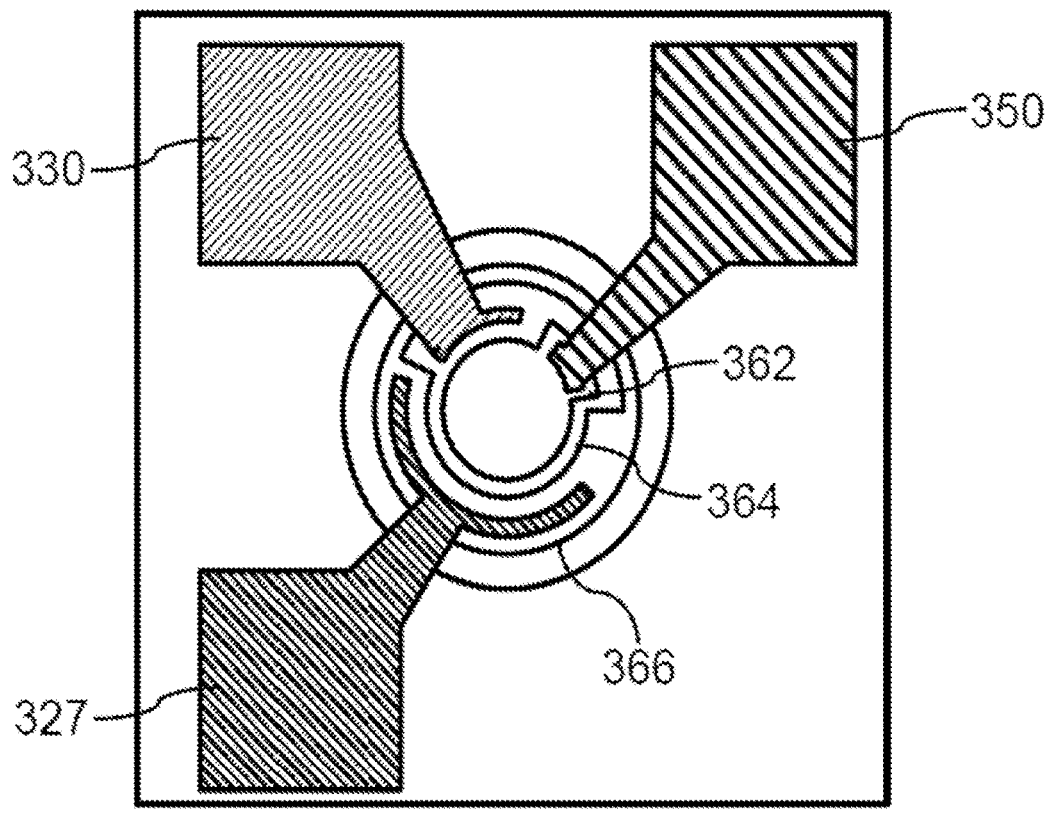
FIG. 5 shows a top view of a fifth VCSEL device with integrated photodiode.

FIG. 5 shows a principal sketch of a top view of a fifth VCSEL device with integrated photodiode. The semiconductor layer structure of the sixth VCSEL device is similar as discussed with respect to FIG. 3. A first electrical contact (n-contact) 105 of the light emitting structure of the VCSEL device is provided on the backside of the substrate and contacted by a first bond pad. A second bond pad 327, which is deposited on a planarization layer, contacts the second electrical contact 127 of the VCSEL device via etch down 364 to a p-contact layer of the light emitting structure of the VCSEL device. A third bond pad 327 contacts the third electrical contact 130 of the VCSEL device via etch down 362 to a re-contact layer of the photodiode of the VCSEL device. A fourth bond pad 350 contacts the top fourth electrical contact 150, the p-contact of the photodiode of the VCSEL device. FIG. 5 shows a further etch down 366 to an aperture layer which is used to provide a current aperture for current confinement in the second DBR.

Figure 6:
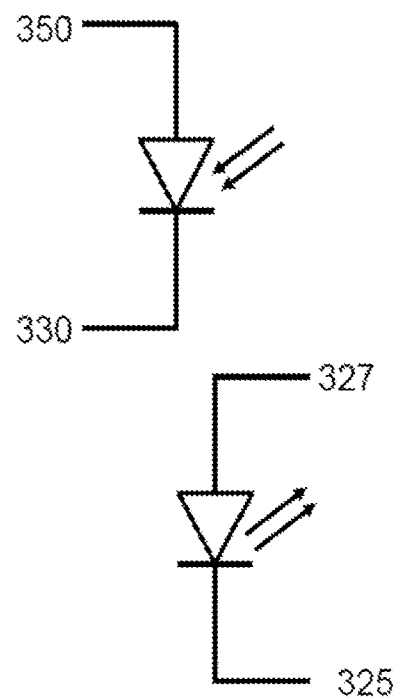
FIG. 6 shows an equivalent circuit of the fifth VCSEL device.

FIG. 6 shows an equivalent circuit of the fifth VCSEL device. The light emitting laser diode of the VCSEL device is contacted via the first bond pad 325 and the second bond pad 327. The photodiode is contacted via the third bond pad 330 and the fourth bond pad 350. Electrical isolation between the laser diode and the photodiode is provided via an isolation structure as discussed with respect to FIG. 3 and FIG. 4.

Figure 7:
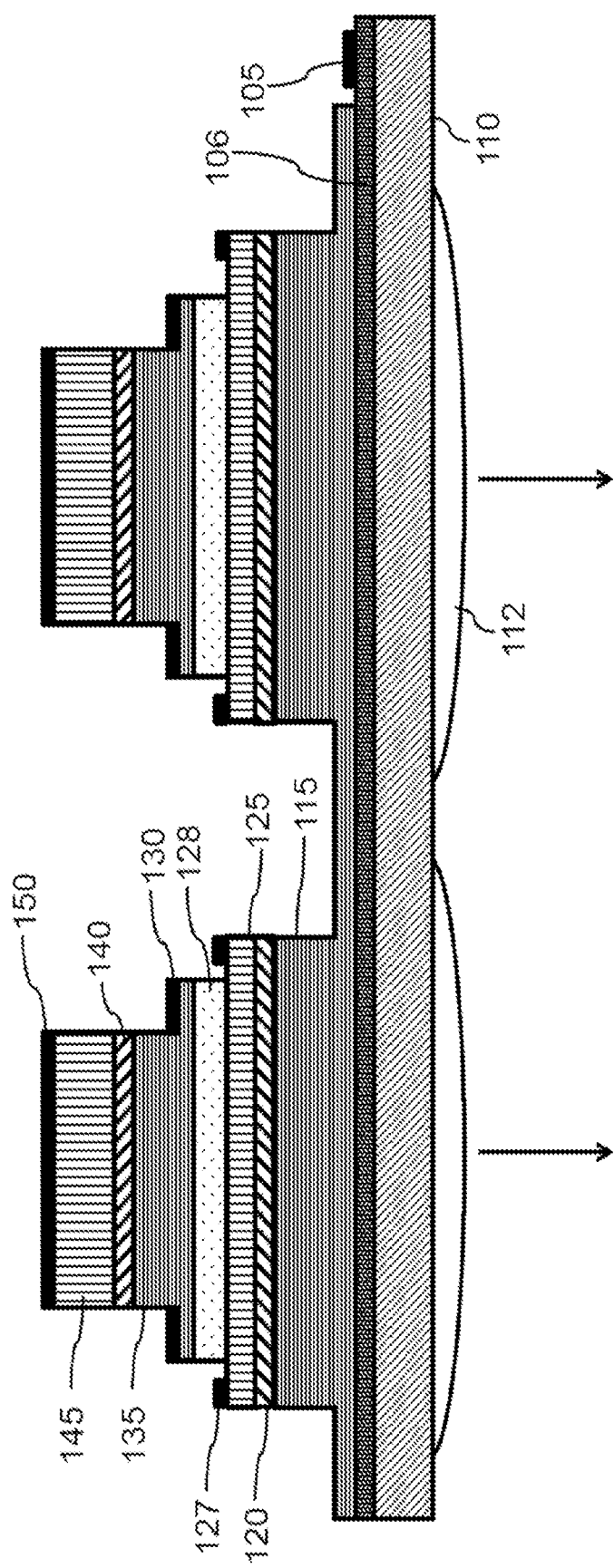
FIG. 7 shows a sixth VCSEL device with integrated photodiode.

FIG. 7 shows a principal sketch of a sixth VCSEL device with integrated photodiode. The sixth VCSEL device is a bottom emitting VCSEL device comprising two VCSELs with integrated photodiode which are arranged on the same substrate 110. The sixth VCSEL device is a bottom emitter emitting laser light (indicated by the arrow) through the substrate 110. Each of the VCSELs with integrated photodiode comprises a first DBR 115, an active layer 120, a first part of a second DBR 125, a second electrical contact 127, an isolation structure 128, a third electrical contact 130, a second part of the second DBR 135, an absorption structure 140, a third part of the second DBR 145, and a fourth electrical contact 150 similar as discussed with respect to FIG. 3. The conductivity types of the first DBR 115 and the different parts of the second DBR 125, 135, 145 are the same as discussed with respect to FIG. 3. The first DBR comprises 30 pairs of layers with alternating refractive index to provide a reflectivity of 98.5% such that the emission of laser light through the substrate 110 is enabled. The first part of the second DBR 125 comprises 20 pairs of layers with alternating refractive index to increase reflectivity of the second (top) DBR. The isolation structure 128 comprises three pairs of layers with alternating refractive index, wherein each of layers comprises a pn-junction. The isolation structure 128 therefore comprises six layers with a n-p-n-p-n-p sequence of conductivity type starting with the layer of the isolation structure 128 attached to the first part of the second DBR 125. The second part of the second DBR 135 comprises seven further pairs of layers with alternating refractive index. And the third part of the second DBR 145 comprises another 10 pairs of layers with alternating refractive index such that the second DBR is characterized by a reflectivity of more than 99.95% in the wavelength range of the emission wavelength of the VCSEL device. The second DBR of each VCSEL with integrated photodiode is finally completely covered by a fourth electrode 150 to provide a p-contact of the photodiode. A n-type common first current distribution layer 106 is arranged between the substrate 110 and the first DBR 115 of the two VCSELs with integrated photodiode. The first current distribution layer 106 is arranged in a node of the standing wave pattern and is contacted by means of the first electrical contact 105. The substrate 110 consists of undoped gallium arsenide to reduce the optical losses. The laser light is emitted via optical structures 112 (e.g. microlens) attached to or etched in the lower surface (surface opposite to the surface on which the semiconductor layers are deposited) of the substrate 110. The second electrical contacts 127 may be common p-contacts of the laser diodes such that all laser diodes emit laser light simultaneously. Common contacts may enable a very compact design of such a VCSEL array. The second electrical contacts 127 may alternatively be individually addressable p-contacts of the laser diodes such that each VCSEL can be individually addressed to emit laser light. The fourth electrical contacts 150 may be contacted by means of flip chip bumps to individually read out the photodiodes of each VCSEL. The VCSEL device may comprise a two-dimensional array of VCSELs with integrated photodiode. Combination of the semiconductor layer structure discussed with respect to FIG. 1 in a bottom emitting array configuration discussed with respect to FIG. 7 with common first electrical contact and common third electrical contact (no second electrical contact) may enable a dense package with a pitch of 20 µm between neighboring VCSELs with integrated photodiode. Only two contact pads are needed to contact the n-contact (first electrical contact) of the laser diodes and the third electrical contract (p-contact of laser diode and n-contact of photodiode). Such laser arrays may comprise 5×5, 6×6, 8×10 etc. laser diodes with integrated photodiodes and may be used in combination with an appropriate optic, for example, for self mixing interference sensors.

Figure 8:
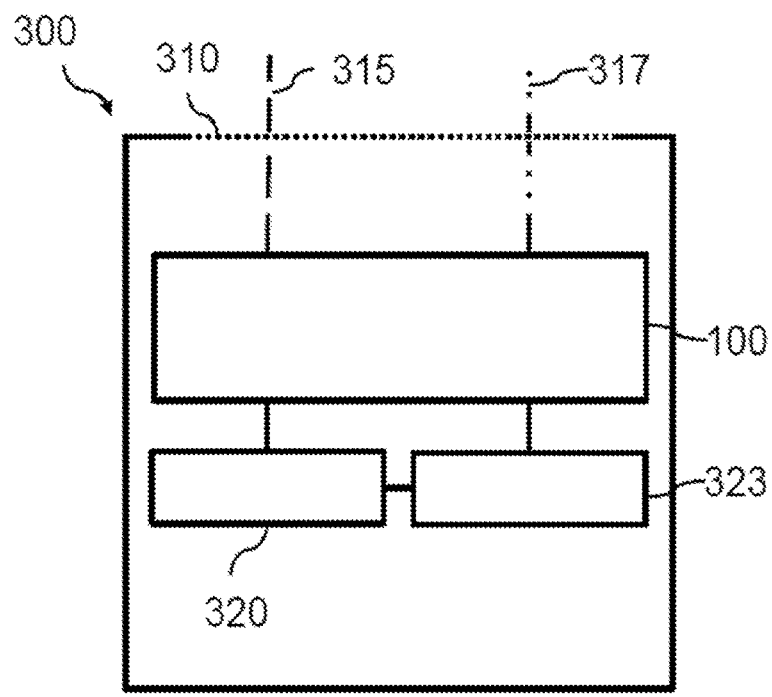
FIG. 8 shows an embodiment of an optical sensor.

FIG. 8 shows a cross-section of an optical sensor 300 according to a first embodiment. The optical sensor 300 is arranged to determine presence, distances and movements of objects by means of self mixing interference measurements. The optical sensor 300 comprises a VCSEL device 100 as discussed above, a transmission window 310 and a driving circuit 320 for electrically driving the VCSEL device 100. The driving circuit 320 is electrically connected to the VCSEL device 100 to supply electrical power to the VCSEL device 100 in a defined way. The driving circuit 320 comprises a memory device for storing data and instructions to operate the driving circuit 320 and a processing unit for executing data and instructions to operate the driving circuit 320. The optical sensor 300 further comprises an evaluator 323. The photodiode or photodiodes comprised by the VCSEL device 100 are arranged to determine variations in the standing wave pattern within the laser cavity coupled to the respective photodiode. The evaluator 323 comprises at least one memory device like a memory chip and at least one processing device like a micro-processor. The evaluator 323 is adapted to receive electrical signals from the VCSEL device 100 and optionally from the driving circuit 320 to determine distances or movements of one or more objects based on the interference of laser light 315 which is reflected by the respective object (reflected laser light 317) and the optical standing wave within the respective laser cavity. The optical sensor may be used for particle detection (e.g. air quality), distance/velocity measurements or user interfaces.

Figure 9:
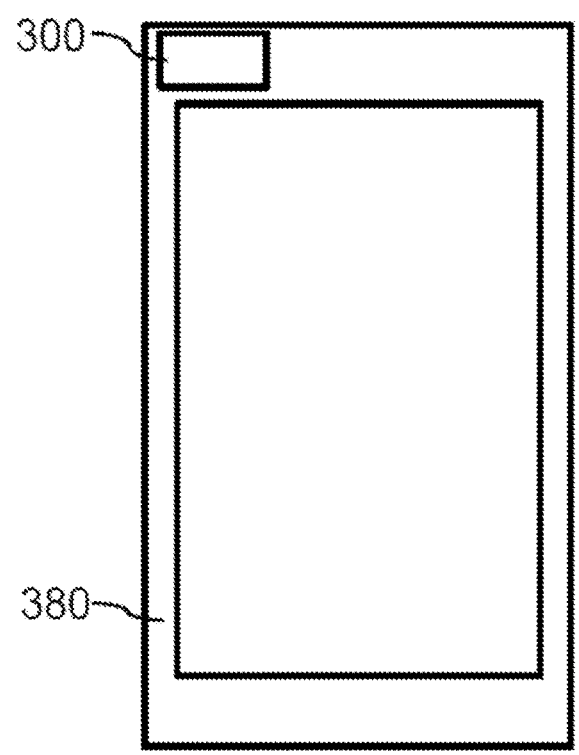
FIG. 9 shows an embodiment of a mobile communication device comprising the optical sensor.

FIG. 9 shows a principal sketch of a mobile communication device 380 comprising an optical sensor 300. The optical sensor 300 can, for example, be used in combination with a software application running on the mobile communication device 380. The software application may use the optical sensor 300 for sensing applications. Such sensing applications may, for example, be a self-mixing interference (SMI) sensor, a particle sensor or a gesture based user interface.

Figure 10:
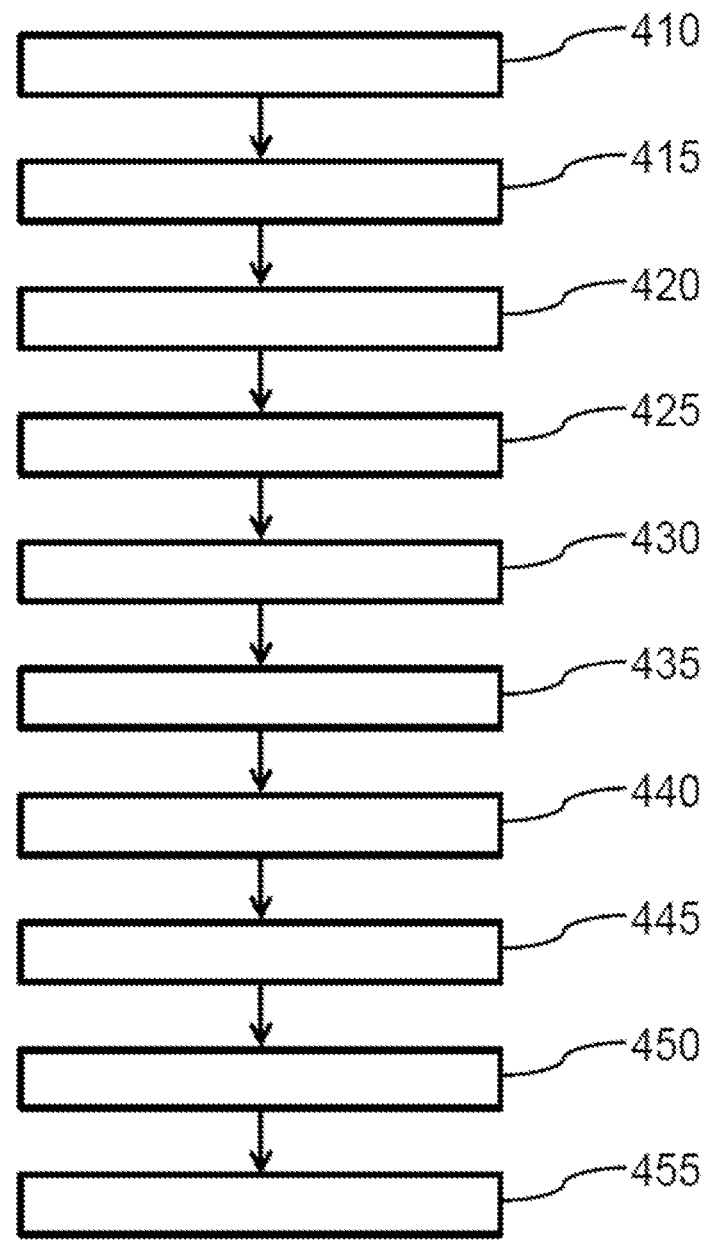
FIG. 10 shows a process flow of a method of fabricating a VCSEL according to an embodiment of the present invention.

FIG. 10 shows a principal sketch of a process flow of a method of fabricating a VCSEL according to the present invention. A substrate 110 is provided in step 410. A first electrical contact 105 is provided in step 415. The first electrical contact 105 and a further electrical contact are arranged to provide an electrical drive current to electrically pump the VCSEL device to emit laser light. In step 420 a first distributed Bragg reflector 115 is provided. An active layer 120 is provided in step 425 such that the first distributed Bragg reflector 115 is arranged between the active layer 120 and the substrate 110. A first part 125 of a second distributed Bragg reflector may be provided in step 430 such that the active layer 120 is arranged between the first distributed Bragg reflector 115 and the first part 125. The first part 125 comprises at least one pair of layers with different refractive indices. The at least one pair of layers is characterized by a second conductivity type. A second part 135 of the second distributed Bragg reflector is provided in step 435. The second part 135 comprises at least one pair of layers with different refractive indices. The at least one pair of layers is characterized by a first conductivity type different than the second conductivity type. A third part 145 of the second distributed Bragg reflector is provided in step 440. The third part 145 comprises at least one pair of layers with different refractive indices. The at least one pair of layers is characterized by the second conductivity type. A light absorption structure 140 of the photodiode is provided in step 445 between the second part 135 and the third part 145. The light absorption structure 140 is arranged outside a current path of the electrical drive current. A third electrical contact 130 is provided in step 450. A fourth electrical contact 150 is provided in step 455. The third electrical contact 130 and the fourth electrical contact 150 are arranged to electrically contact the photodiode.

Providing of the electrical contacts may comprise one or more steps of etching down with an appropriate etching technology (dry etching, wet etching etc.) to the respective contact layer as described above with respect to FIG. 4. The fabrication process may further comprise an oxidation process in order to provide an oxide aperture in each VCSEL of the VCSEL device. The fabrication process may further comprise a passivation or planarization process to provide a smooth surface for depositing bond pads (see, for example, FIG. 5). The substrate 110 may be grinded after depositing the semiconductor layers of the VCSEL structure. The n-contact of the VCSEL diode or VCSEL diodes may be provided after thinning or grinding of the substrate 110 on the thinned backside of the substrate.

The layers of the first DBR, the active layer and any other layer as current injection layers and the like may be deposited by epitaxial methods like MOCVD or MBE.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 105 first electrical contact
106 first current distribution layer
110 substrate
112 optical structure
115 first DBR
120 active layer
125 first part of second DBR
127 second electrical contact
128 isolation structure
130 third electrical contact
135 second part of second DBR
140 absorption structure
141 intrinsic layer
145 third part of second DBR
148 grating
150 fourth electrical electrode
201 aluminum concentration
203 distance to laser facet
211 aluminum profile
213 standing wave pattern
300 optical sensor
310 transmission window
315 emitted laser light
317 reflected laser light
320 driving circuit
323 evaluator
325 first bond pad
327 second bond pad
330 third bond pad
350 fourth bond pad
362 etch down to photodiode cathode contact layer
364 etch down to the VCSEL anode contact layer
366 etch down to aperture layer
380 mobile communication device
410 step of providing a substrate
415 step of providing a first electrical contact
420 step of providing a first DBR
425 step of providing an active layer
430 step of providing a first part of second DBR
435 step of providing a second part of the second DBR
440 step of providing a third part of the second DBR
445 step of providing a light absorption structure
450 step of providing third electrical contact
455 step of providing fourth electrical contact

The invention claimed is:

1. A vertical cavity surface emitting laser device comprising:
a substrate;
a first electrical contact;
a second electrical contact;
a third electrical contact;
a fourth electrical contact; and
an optical resonator,
wherein the optical resonator comprises:
a first distributed Bragg reflector on the substrate, the first distributed Bragg reflector being a bottom end mirror of the optical resonator;
an active layer for light emission on the first distributed Bragg reflector;
a photodiode; and
a second distributed Bragg reflector on the active layer, the second distributed Bragg reflector being a top end mirror of the optical resonator;
wherein the second distributed Bragg reflector comprises a first part, a second part, and a third part,
wherein the first part comprises at least one first pair of layers with different refractive indices,
wherein the at least one first pair of layers is of a second conductivity type,
wherein the second part comprises at least one second pair of layers with different refractive indices,
wherein the at least one second pair of layers is is of a first conductivity type different than the second conductivity type,
wherein the third part comprises at least one third pair of layers with different refractive indices,
wherein the at least one third pair of layers is of the second conductivity type,
wherein a light absorption structure of the photodiode is arranged between the second part and the third part of the second distributed Bragg reflector,
wherein the first electrical contact and the second electrical contact are arranged to provide an electrical drive current to electrically pump the optical resonator,
wherein the light absorption structure is arranged outside a current path of the electrical drive current,
wherein the third electrical contact and the fourth electrical contact are arranged to electrically contact the photodiode,
wherein the second electrical contact electrically contacts the first part of the second distributed Bragg reflector,
wherein the third electrical contact electrically contacts the second part of the second distributed Bragg reflector, and
wherein the second electrical contact and the third electrical contact are separated by a semiconductor layer structure.

2. The vertical cavity surface emitting laser device according to claim 1, wherein laser light is emitted through the second distributed Bragg reflector.

3. The vertical cavity surface emitting laser device according to claim 1, wherein the substrate is of the first conductivity type, and wherein the first distributed Bragg reflector is of the first conductivity type.

4. The vertical cavity surface emitting laser device according to claim 1, wherein the first conductivity type is characterized by n-doped material and wherein the second conductivity type is characterized by p-doped material.

5. The vertical cavity surface emitting laser device according to claim 1, wherein the semiconductor layer structure is an isolation structure arranged to electrically isolate the third electrical contact from the second electrical contact.

6. The vertical cavity surface emitting laser device according to claim 5, wherein the isolation structure comprises at least one pair of layers, each of the pair of layers comprising a first layer with the first refractive index and a second layer with a second refractive index different than the first refractive index.

7. The vertical cavity surface emitting laser device according to claim 6,
wherein the isolation structure comprises several pair of layers, comprising the at least one pair of layers, which comprises the first layer and the second layer, and
wherein at least two of the first layers are of the first conductivity type and wherein at least two of the second layers are of the second conductivity type.

8. The vertical cavity surface emitting laser device according to claim 1, wherein laser light is emitted through the first distributed Bragg reflector.

9. The vertical cavity surface emitting laser device according to claim 8, further comprising a first current distribution layer arranged between the substrate and the first distributed Bragg reflector,
wherein the first current distribution layer is electrically connected to the first electrical contact, and
wherein the substrate comprises an undoped semiconductor material.

10. The vertical cavity surface emitting laser device according to claim 1, wherein the first part and the second part of the second distributed Bragg reflector comprises more pair of layers of different refractive indices than the third part of the second distributed Bragg reflector.

11. The vertical cavity surface emitting laser device according to claim 1, wherein the absorption structure comprises an intrinsic layer with a thickness of less than 100 nanometers.

12. The vertical cavity surface emitting laser device according to claim 11, wherein the intrinsic layer is configured to be in an anti-node of a standing wave pattern in the optical resonator during operation of the vertical cavity surface emitting laser device.

13. An optical sensor comprising the vertical cavity surface emitting laser device according to claim 1.

14. A method of fabricating a vertical cavity surface emitting laser device, the method comprising:
providing a substrate;
providing a first electrical contact;
providing a second electrical contact, wherein the first electrical contact and the second electrical contact are arranged to provide an electrical drive current to electrically pump an optical resonator of the vertical cavity surface emitting laser device;
providing a first distributed Bragg reflector on the substrate;
providing an active layer for light emission on the first distributed Bragg reflector;
providing a first part of a second distributed Bragg reflector on the active layer, wherein the first distributed Bragg reflector, the active layer and the second distributed Bragg reflector form the optical resonator, the first distributed Bragg reflector being a bottom end mirror of the optical resonator, the second distributed Bragg reflector being a top end mirror of the optical resonator, wherein the first part comprises at least one first pair of layers with different refractive indices, and wherein the at least one first pair of layers is of a second conductivity type;
providing a second part of the second distributed Bragg reflector on the first part of the second distributed Bragg reflector, wherein the second part comprises at least one second pair of layers with different refractive indices, and wherein the at least one pair of layers is of a first conductivity type different than the second conductivity type;
providing a third part of the second distributed Bragg reflector on the second part of the second distributed Bragg reflector, wherein the third part comprises at least one third pair of layers with different refractive indices, and wherein the at least one third pair of layers is of the second conductivity type;
providing a light absorption structure of a photodiode between the second part and the third part of the second distributed Bragg reflector, wherein the light absorption structure is arranged outside a current path of the electrical drive current;
providing a third electrical contact;
providing a fourth electrical contact, wherein the third electrical contact and the fourth electrical contact are arranged to electrically contact the photodiode;
electrically contacting the first part of the second distributed Bragg reflector by the second electrical contact;
electrically contacting the second part of the second distributed Bragg reflector by the third electrical contact; and
separating the second electrical contact and the third electrical contact by a semiconductor layer structure.

\* \* \* \* \*